(12) United States Patent
Mair et al.

(10) Patent No.: US 7,164,291 B2
(45) Date of Patent: Jan. 16, 2007

(54) INTEGRATED HEADER SWITCH WITH LOW-LEAKAGE PMOS AND HIGH-LEAKAGE NMOS TRANSISTORS

(75) Inventors: Hugh T. Mair, Fairview, TX (US); David B. Scott, Plano, TX (US); Rolf Lagerquist, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 23 days.

(21) Appl. No.: 10/916,135

(22) Filed: Aug. 11, 2004

(65) Prior Publication Data

US 2006/0033525 A1    Feb. 16, 2006

(51) Int. Cl.
*H03K 19/0175* (2006.01)
*G05F 1/10* (2006.01)
(52) U.S. Cl. .................... 326/83; 326/33; 327/544
(58) Field of Classification Search ................ 326/83, 326/33; 327/544
See application file for complete search history.

(56) References Cited

U.S. PATENT DOCUMENTS

2004/0080340 A1*  4/2004  Hidaka ................... 326/83

* cited by examiner

*Primary Examiner*—Vibol Tan
(74) *Attorney, Agent, or Firm*—Ronald O. Neerings; W. James Brady, III; Frederick J. Telecky, Jr.

(57) ABSTRACT

System and method for providing power with a large on-current and small off-current to circuitry in an integrated circuit. A preferred embodiment comprises a switch for providing power to circuits in an integrated circuit made from a PMOS transistor and an NMOS transistor coupled in parallel. Each transistor's gate terminal is coupled to a separate control signal line. The PMOS transistor provides current to the circuits at high voltage supply levels while the NMOS transistor provides current to the circuits at low voltage supply levels, wherein the size of the PMOS and NMOS transistor can be changed during design to meet power requirements. Depending upon power requirements, multiple PMOS and NMOS transistors may be used. The combination of PMOS and NMOS transistors permit the use of limited fabrication processes wherein transistor widths can be limited.

19 Claims, 4 Drawing Sheets

INTEGRATED HEADER SWITCH WITH LOW-LEAKAGE PMOS AND HIGH-LEAKAGE NMOS TRANSISTORS

TECHNICAL FIELD

The present invention relates generally to a system and method for providing power to integrated circuits, and more particularly to a system and method for providing power with a large on-current and a small off-current to circuitry in integrated circuits.

BACKGROUND

In order for logic circuitry in an integrated circuit to operate, it is necessary to provide power to the logic circuits. To power logic circuits, it may be necessary to provide a power supply connection and a ground connection. Furthermore, in order to minimize power consumption when the logic circuitry is inactive, it is desired that leakage current be minimized. Therefore, it is desired to have a large on-current to off-current ratio.

Header and footer configurations are commonly used ways to provide the connections to the logic circuits, wherein a header configuration uses a switch to couple (and decouple) the logic circuits to a power supply and a footer configuration uses a switch to couple (and decouple) the logic circuits to a ground connection. Therefore, to provide power to the logic circuits, switches in both the header and the footer configurations could close, providing a current path from the power supply to the ground. For example, in a header configuration, typically PMOS (P-type Metal Oxide Semiconductor) transistors can be used as a switch to cut the power supply connection to the logic circuits, while in a footer configuration, typically NMOS (N-type Metal Oxide Semiconductor) transistors can be used to cut the ground connection to the logic circuits.

Variations in the header and footer configurations have included the use of high threshold voltage and low threshold voltage PMOS and NMOS transistors to help improve the on-current to off-current ratio. In some variations, even NMOS transistors have been used as switches in header configurations. In certain manufacturing processes, wherein it may be possible to create transistors with wide variations in geometries (and other parameters), the use of the header and footer configurations can provide both a large on-current and a small off-current.

One disadvantage of the prior art is that in many manufacturing processes wherein the ability to vary the widths of transistors is limited, it may be difficult to use standard transistors in the header and footer configurations and still provide both a large on-current and a small off-current.

A second disadvantage of the prior art is that the use of high and low threshold voltage transistors may preclude the use of a manufacturing process wherein a limited number of transistor sizes may be used. The use of transistors with limited sizes can reduce the ability to provide a satisfactory on-current to off-current ratio.

SUMMARY OF THE INVENTION

These and other problems are generally solved or circumvented, and technical advantages are generally achieved, by preferred embodiments of the present invention which provides for a system and method for providing power with a large on-current and a small off-current to circuitry in integrated circuits.

In accordance with a preferred embodiment of the present invention, a combination header switch for use in providing power to circuitry in an integrated circuit, wherein the combination header switch comprises a PMOS (P-type Metal Oxide Semiconductor) transistor having a gate terminal coupled to a first control signal line, an NMOS (N-type Metal Oxide Semiconductor) transistor having a gate terminal coupled to a second control signal line, and wherein each transistor's first terminals are coupled to a voltage supply and each transistor's second terminals are coupled to an output of the combination header switch, and wherein the size of the PMOS and NMOS transistors are adjusted to provide required current levels to the circuitry as a function of voltage supply level is provided.

In accordance with another preferred embodiment of the present invention, an integrated circuit comprising a logic circuit and a combination header switch coupled between a voltage supply and the logic circuit, the combination header switch configured to provide current to the logic circuit as a function of the level of the voltage supply, wherein the combination header switch comprises a PMOS (P-type Metal Oxide Semiconductor) transistor having a gate terminal coupled to a first control signal line, an NMOS (N-type Metal Oxide Semiconductor) transistor having a gate terminal coupled to a second control signal line, and wherein the NMOS transistor comprises a plurality of NMOS transistors coupled in parallel and the PMOS transistor comprises a plurality of PMOS transistors coupled in parallel is provided.

In accordance with yet another preferred embodiment of the present invention, a method for designing an integrated circuit, the method comprising specifying frequency targets for the logic gates within the integrated circuit, determining currents to the logic gates based on the frequency targets, and then sizing a combination header switch so that the combination header switch can provide the determined currents is provided.

An advantage of a preferred embodiment of the present invention is that a header switch with a large on-current to off-current ratio can be created using a manufacturing process wherein the manufacturing process is not capable of fabricating transistors with a wide range of sizes (and perhaps other parameters). This can enable the use of these limited fabrication processes, possibly resulting in a lower unit cost for the integrated circuits since a design with fewer transistor types can be used.

A further advantage of a preferred embodiment of the present invention is that the design of the header switch can be readily adapted to meet different current needs of different integrated circuits. Therefore, the header switch can be modified for each integrated circuit design's needs, thereby offering optimized performance. Additionally, since the header switch can be modified for an integrated circuit's needs, there is no need to use a header switch with more capability than required. This can minimize cost by reducing unneeded hardware.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a header switch for providing power to logic circuitry in an integrated circuit made using a manufacturing process wherein the process may limit the types of transistors available. The invention may also be applied, however, to header switches for use in integrated circuits manufactured using any of a wide variety of manufacturing processes, from processes with a limited number of transistors types to those with unlimited number of transistor types, where there is interest in minimizing hardware usage and costs.

Figure 1:
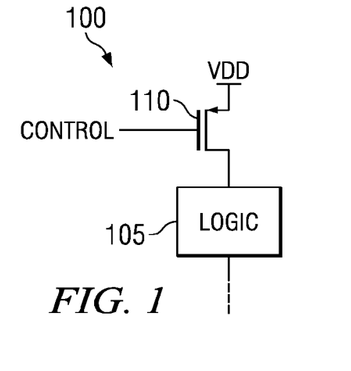
FIG. 1 is a diagram of a schematic of a header configuration used to provide a voltage supply to a circuit.

With reference now to FIG. 1, there is shown a diagram illustrating a schematic of a header configuration 100 used to provide a voltage supply to a circuit. The header configuration 100 can be used to control the connection of a voltage supply ("VDD" in this case) to a logic circuit 105. Typically, a PMOS (P-type Metal Oxide Semiconductor) transistor 110 can be used as a switch to couple (or decouple) the voltage supply to the logic circuit 105. Depending upon the value of a control signal, the PMOS transistor 110 can be open or closed. When open, the PMOS transistor 110 effectively decouples the logic circuit 105 from the voltage supply. However, when the PMOS transistor 110 is closed, the logic circuit 105 is coupled to the voltage supply.

Figure 2:
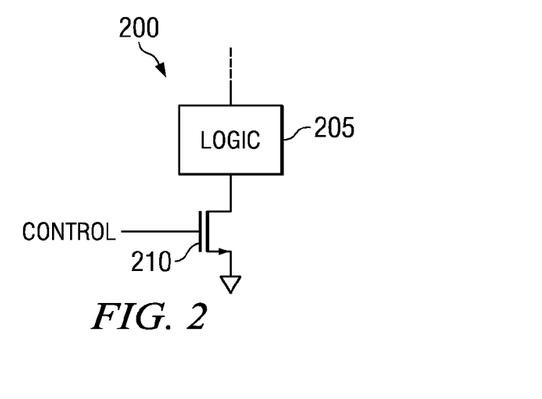
FIG. 2 is a diagram of a schematic of a footer configuration used to provide an electrical ground to a circuit.

With reference now to FIG. 2, there is shown a diagram illustrating a schematic of a footer configuration 200 used to provide an electrical ground to a circuit. The footer configuration 200 can be used to control the connection of an electrical ground to a logic circuit 205. Normally, an NMOS (N-type Metal Oxide Semiconductor) transistor 210 can be used as a switch to couple (or decouple) the electrical ground to the logic circuit 205. Depending upon the value of a control signal, the NMOS transistor 210 can be open or closed. When open, the NMOS transistor 210 effectively decouples the logic circuit 205 from the electrical ground. However, when the NMOS transistor 210 is closed, the logic circuit 205 is coupled to the electrical ground.

A significant problem with using the header and/or footer configuration for providing power to logic circuits in an integrated circuit is that the transistors used as switches (usually PMOS in a header configuration and NMOS in a footer configuration) can have measurable leakage current, even when they are off. This can be especially true in manufacturing processes with limited transistor type availability, wherein the transistors used as switches are normally the same type as the ones used in the logic circuits and high threshold voltage transistors are typically not available for use. The leakage current can result in a current drain, even when the logic circuits are supposed to be in an off (or suspended) state. The current drain can increase power consumption and can result in shorter battery life in wireless applications.

Figure 3A:
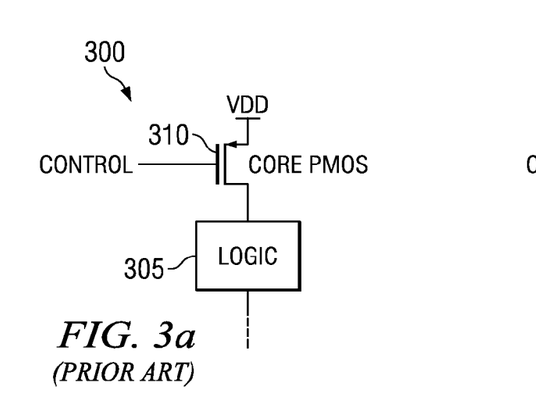
FIGS. 3a through 3c are diagrams of schematics of prior art implementations of header and footer configurations used to provide power to a circuit while maintaining a high on-current to off-current ratio.
Figure 3B:
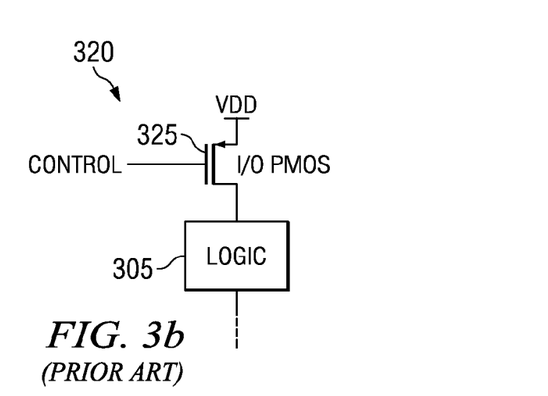
Figure 3C:
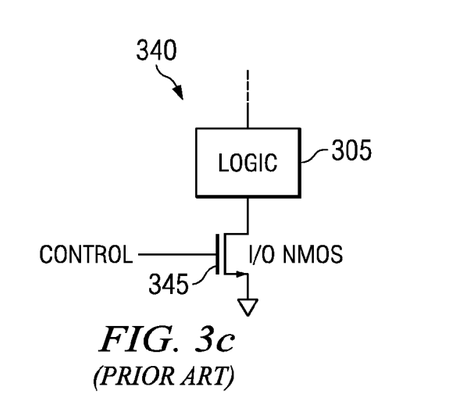

With reference now to FIGS. 3a through 3c, there are shown diagrams illustrating schematics of prior art implementations of header and footer configurations used to provide power to a circuit while maintaining a high on-current to off-current ratio. In a limited manufacturing process, there are typically no high threshold voltage transistors available for use in creating a header or footer configuration with a high on-current to off-current ratio. Usually, the transistors available may include core transistors (transistors used in the fabrication of logic gates) and I/O transistors (transistors used to drive input/output pins). The I/O transistors may have the same geometry (source/drain profiles) as the core transistors but tend to be larger in size. This may imply an abrupt junction with a significant diode leakage current.

FIG. 3a illustrates a schematic of a prior art header configuration 300 using a PMOS core transistor 310 to provide a voltage supply to a logic circuit 305. This solution is generally unacceptable due to off-state sub-threshold leakage. The effective leakage current reduction may not be able to exceed a factor of ten (10) due to the need for a large PMOS transistor to deliver sufficient active mode current.

FIG. 3b illustrates a schematic of a prior art header configuration 320 using a PMOS I/O transistor 325 to provide a voltage supply to the logic circuit 305. The use of the PMOS I/O transistor 325 can provide the necessary ratio of on-current to off-current, but may be deficient in that a limit may be place upon the amount of power supply reduction that can be achieved when operating in active mode. Not being able to provide a full range of low-voltage supplies to the logic circuit 305 can be a significant disadvantage.

FIG. 3c illustrates a schematic of a prior art footer configuration 340 using an NMOS I/O transistor 345 to provide an electrical ground to the logic circuit 305. The footer configuration 340 may have a significant advantage in that the gate of the NMOS I/O transistor 345 can be placed at a voltage potential that is greater than the core voltage. Therefore, a full range of low-voltage supplies can be provided to the logic circuit 305. However, the NMOS I/O transistor 345 may have an off-state leakage current that is dominated by the diode leakage typical of core NMOS transistors, which can be prohibitively large.

Figure 4:
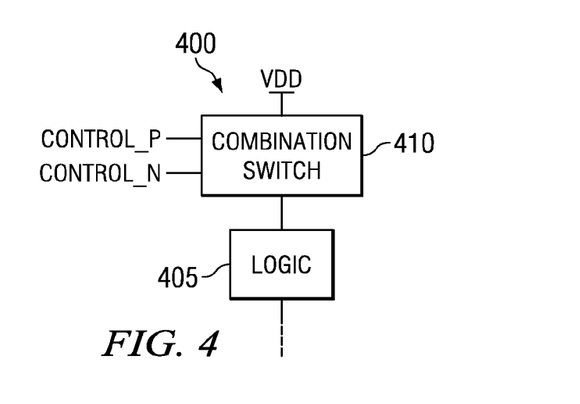
FIG. 4 is a diagram of a high-level view of a schematic of a header configuration used to provide a voltage supply to a logic circuit, wherein a combination switch is used to provide a high on-current to off-current ratio, according to a preferred embodiment of the present invention.

With reference now to FIG. 4, there is shown a diagram illustrating a high-level view of a schematic of a header configuration 400 used to provide a voltage supply to a logic circuit 405, wherein a combination switch 410 is used to provide a high on-current to off-current ratio, according to a preferred embodiment of the present invention. The configuration of the header configuration 400 is similar to the header configuration 100 (FIG. 1) with a combination switch 410 being used to control a connection between a voltage supply ('VDD') and the logic circuit 405. According to a preferred embodiment of the present invention, the combination switch 410 can be made out of a combination of both PMOS and NMOS transistors, wherein the PMOS transistor can be used to provide the requisite high on-current to off-current ratio and the NMOS transistor can provide the desired low-voltage operation. Preferably, the PMOS transistor can be fabricated out of an I/O transistor while the NMOS transistor can be fabricated out of a core transistor. Note that it may be possible for the combination switch 410 to be disjoint with the logic 405. For example, the combination switch 410 and the logic 405 may be on different silicon dice, such as on a multi-chip module. Alternatively, the combination switch 410 may be implemented external to a packaged version of the logic 405.

The combination of the I/O PMOS transistor with the core NMOS transistor in the combination switch 410 can enable low voltage operation without compromising the off-current. According to a preferred embodiment of the present invention, the majority of the current provided by the combination switch 410 is provided by the I/O PMOS transistor when operating at high voltages. However, at low operating voltages, the I/O PMOS transistor can be turned off and the core NMOS transistor can be turned on. Since the current requirements at the lower operating voltages can be significantly smaller than the current requirements at the higher operating voltages, a relaxation in the size of the core NMOS transistors can be realized. Note that since the off-current of the core NMOS transistor can be greater than 100 times the off-current of the I/O PMOS transistor under equivalent biasing conditions, the ability to size the core NMOS transistor to be a very small percentage of the size of the I/O PMOS transistor can have a positive effect on the off-current. A detailed description of the determination of the size of the core NMOS and I/O PMOS transistors is presented below.

As discussed above, depending upon the requisite high on-current to off-current ratio and the desired low-voltage operation, a ratio of PMOS to NMOS transistors can be specified. A key to the design of the combination switch 410 may be the specification of the size of the PMOS and NMOS transistors so that sufficient high-frequency/high-voltage performance is provided along with sufficient low-frequency/low-voltage performance. Note that it may be necessary to use multiple transistors to meet the overall transistor size requirement. For example, an actual implementation of the combination switch 410 may use approximately 50 PMOS I/O transistors and 5 NMOS core transistors.

The combination switch 410 can be controlled by a pair of control signals, "CONTROL_P" and "CONTROL_N." The control signal "CONTROL_P" can be used to control the state of the PMOS transistors, while the control signal "CONTROL_N" can be used to control the state of the NMOS transistors. Alternatively, a single control signal "CONTROL" can be used to control the state of both the PMOS and the NMOS transistors, wherein the control signal "CONTROL" may be internally inverted when provided to either the PMOS or the NMOS transistor.

Figure 5:
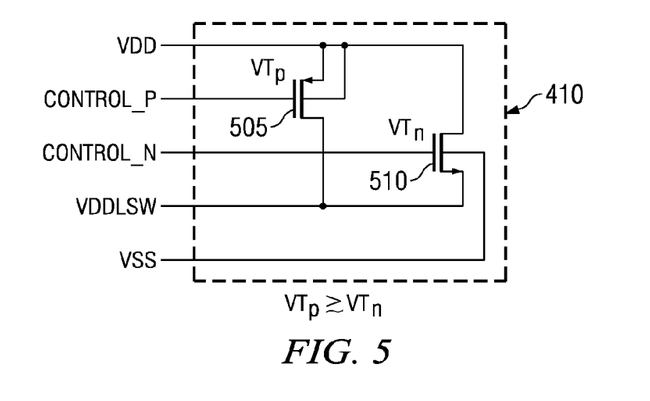
FIG. 5 is a diagram of a schematic of the combination switch, according to a preferred embodiment of the present invention.

With reference now to FIG. 5, there is shown a diagram illustrating a schematic of the combination switch 410, according to a preferred embodiment of the present invention. As discussed previously, the combination switch 410 can be made from a combination of PMOS NMOS transistors, preferably, an I/O transistor for the PMOS transistor and a core transistor for the NMOS transistor, wherein the size (and therefore, the number) of the transistors can be adjusted to meet desired performance specifications. Note that the schematic of the combination switch 410 shown in FIG. 5 does not convey size and/or number information regarding the PMOS and NMOS transistors.

The combination switch 410 comprises a PMOS transistor 505 coupled in parallel with an NMOS transistor 510, with the source terminal of the PMOS transistor 505 and the drain terminal of the NMOS transistor 510 being coupled to the voltage supply ("VDD"). The drain terminal of the PMOS transistor 505 and the source terminal of the NMOS transistor 510 are coupled together (shown in FIG. 5 as "VDDLSW") and can be coupled to a logic circuit, such as the logic circuit 405 (FIG. 4). The drain terminal of the PMOS transistor 505 and the source terminal of the NMOS transistor 510 may be considered to be the output of the combination switch 410. A control signal for the PMOS transistor 505, "CONTROL_P," may be coupled to the gate terminal of the PMOS transistor 505, while a control signal for the NMOS transistor 510. "CONTROL_N," may be coupled to tho NMOS transistor's gate terminal. The PMOS transistor 505 and NMOS transistor 510 may have their bulk connections coupled to different voltage supplies. "VDD" and "VSS," respectively. Note that in general, the source and drain terminals of MOS transistors are symmetrical (i.e., they can be interchangeable), therefore, for discussion purposes, the source terminal is usually connected to the power supply. However, it can be possible to change the notation of the terminals of the MOS transistors without changing the spirit of the present invention. As an alternative to the combination switch 410 being built out of a PMOS transistor in parallel with an NMOS transistor, where the threshold voltage of the PMOS transistor (VTp) is larger (within normal fabrication tolerances) than the threshold of the NMOS transistor (VTn), it may be possible to use a high threshold voltage PMOS transistor in parallel with a low threshold voltage PMOS transistor to create a combination switch (note that this particular configuration is not shown).

As discussed previously, it may be necessary to adjust the size of the PMOS and NMOS transistors used in the combination switch 410 in order to meet performance requirements. In certain manufacturing processes, it can be relatively simple to fabricate transistors with different dimensions. However, in a limited manufacturing process, it may be difficult (if not impossible) to create transistors with geometries different from the few allowed in the manufacturing process. One way that can be used to fabricate large transistors may be to use multiple transistors in place of a single large transistor.

Figure 6A:
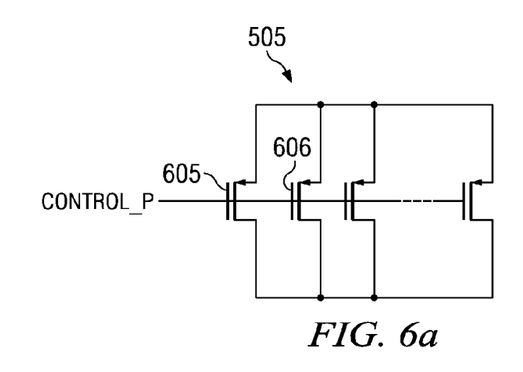
FIGS. 6a and 6b are diagrams of schematics of PMOS and NMOS transistors used in the combination switch, according to a preferred embodiment of the present invention.
Figure 6B:
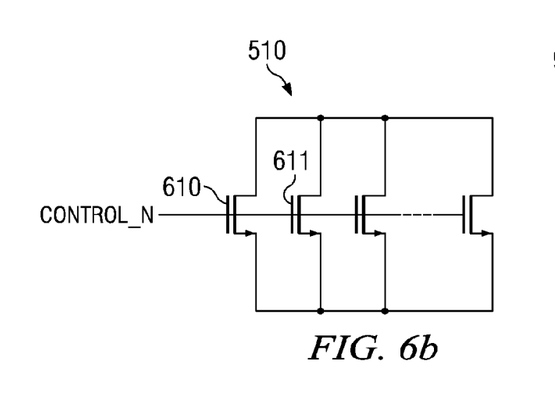

With reference now to FIGS. 6a and 6b, there are shown diagrams illustrating schematics of the PMOS and NMOS transistors used in the combination switch 410, according to a preferred embodiment of the present invention. FIG. 6a displays a possible arrangement for increasing the size of PMOS transistors, such as the PMOS transistor 505 (FIG. 5), when the manufacturing process is limited in creating transistors with sizes that differ from the specified sizes. According to a preferred embodiment of the present invention, a plurality of PMOS transistors, such as PMOS transistors 605 and 606, can be arranged in parallel to produce a PMOS transistor with a larger effective size. FIG. 6b displays a similar arrangement for increasing the size of NMOS transistors using a plurality of NMOS transistors, such as NMOS transistors 610 and 611.

As discussed previously, the sizing of the PMOS and NMOS transistors 505 and 510 can be adjusted to meet performance requirements. For example, the size of the PMOS transistor 505 can be adjusted to cover the high-frequency/high-voltage operation requirements and the size of the NMOS transistor 510 can be adjusted to cover the low-frequency/low-voltage operation requirements. This can be achieved by specifying operating frequency targets as a function of power supply voltage.

Figure 7:
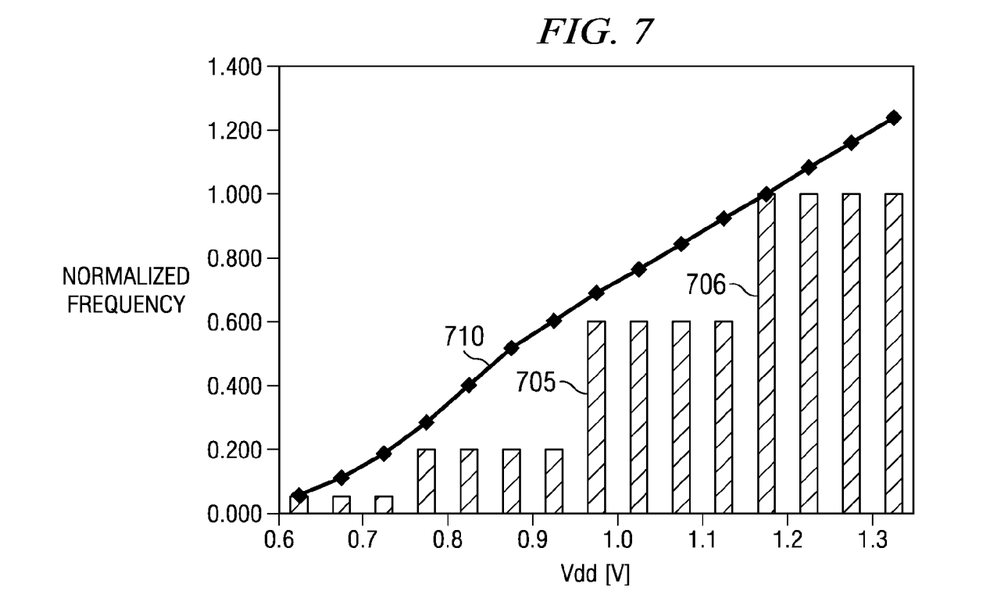
FIG. 7 is a data plot of exemplary frequency targets as a function of power supply voltage, according to a preferred embodiment of the present invention.

With reference now to FIG. 7, there is shown a data plot illustrating exemplary frequency targets as a function of power supply voltages, according to a preferred embodiment of the present invention. The data plot displays a series of bars, such as bars 705 and 706, that may be representative of logic circuit capability as a function of voltage. For example, bar 705 shows that the logic circuit is capable of operating at 60% of maximum operating frequency at a voltage supply of 0.95 volts while bar 706 shows that the logic circuit is capable of operating at 100% of maximum operating frequency at a voltage supply of 1.15 volts. The bars can indicate what is referred to as specified performance, i.e., when a voltage supply at a certain voltage is provided to the logic circuit, it is expected to operate at a certain percentage of maximum operating frequency. Note that the bars (representing operating frequency as a function of voltage supply levels) can be different for different circuits and the data plot shown in FIG. 7 may be representative of the performance of an exemplary integrated circuit. The data displayed in FIG. 7 should not be construed as being limiting upon the spirit of the present invention.

With the frequency targets specified (displayed in FIG. 7 as bars, such as the bars 705 and 706), it is now possible to determine an entitled speed as a function of voltage for the logic circuit. This is displayed in FIG. 7 as the diagonal line 710. The entitled speed provides an upper limit on the operating frequency of the logic circuit at different voltage supply values. Note that it should not be necessary to provide power sufficient for a frequency that the underlying circuit is not capable of achieving. For example, in FIG. 7, with the voltage supply at 0.9 volts, the logic circuit is capable of operating at up to 20% of maximum operating frequency. Therefore, even if more power is provided, the logic circuit will not exceed 20% of maximum operating frequency. Ideally, the diagonal line 710 representing the entitled speed should be a simple curve that is monotonic in nature. This can enable easier matching in subsequent steps.

Figure 8:
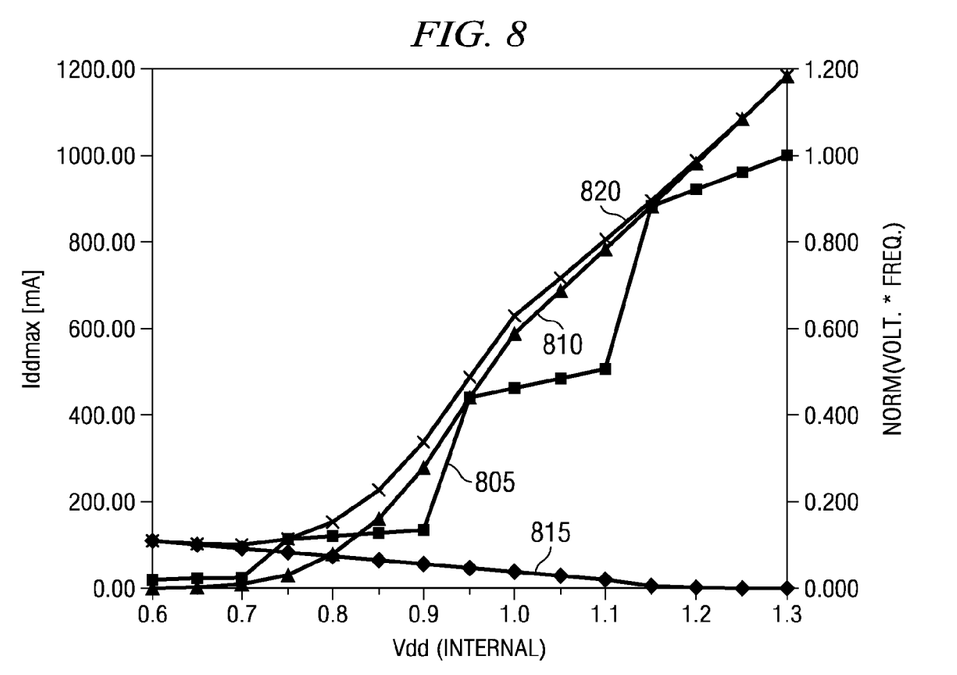
FIG. 8 is a data plot of current requirements corresponding to the exemplary frequency targets shown in FIG. 7, according to a preferred embodiment of the present invention.

With reference now to FIG. 8, there is shown a data plot illustrating current requirements corresponding to the exemplary frequency targets as shown in FIG. 7, according to a preferred embodiment of the present invention. After determining the speed bins (specifying the frequency targets as a function of power supply voltage), it may now be possible to determine the amount of current for each point displayed in the data plot shown in FIG. 7. The current corresponding to a point in the data plot can be calculated using the formula: P=V*F (wherein P=power, V=voltage, and F=frequency). In FIG. 8, a first curve 805 displays the normalized current. The data points for the first curve 805 may be obtained from the frequency targets specified in FIG. 7 multiplied with the voltage supply voltage.

Based upon the information contained in the first curve 805, the PMOS transistor 505 can be sized to provide the needed current at higher voltage supply levels. A second curve 810 can illustrate the current provided by the PMOS transistor 505 as a function of voltage supply levels. Note however, that at lower voltage supply levels, the current provided by the PMOS transistor 505 is not sufficient. Therefore, the NMOS transistor 510 also needs to be sized in order to provide sufficient current at lower voltage supply levels. A third curve 815 can illustrate the current provided by the NMOS transistor 510 as a function of voltage supply levels. Note that at the lower voltage supply levels, the current provided by the NMOS transistor 510 is small, therefore, a relatively small NMOS transistor 510 may be able to provide the needed current. It can be important to minimize the size of the NMOS transistor 510 since the off-current of a NMOS transistor can be significantly greater than the off-current of a PMOS transistor. Therefore, the size of the NMOS transistor 510 should be as small as possible and yet still be capable of providing the needed current.

The total current provided to the logic circuits can then be defined as a sum of the currents provided by the PMOS transistor 505 and the NMOS transistor 510. A fourth curve 820 illustrates the total current provided to the logic circuits and is the sum of the second curve 810 and the third curve 815. Note that at all voltage supply levels, the fourth curve 820 (the current provided by the combination switch 410) is greater than or equal to the first curve 805 (the current needed by the logic circuits at different voltage supply levels).

When the current to be provided to the circuitry in the integrated circuit can be specified as a function of voltage supply level, it may then be possible to provide just enough current to the circuitry instead of providing more current than necessary. For example, as shown in FIG. 8 (the first curve 805 and the fourth curve 820) the current required by the circuitry at a low voltage supply level may be only a small fraction of the current required by the circuitry at a high voltage supply level (less than 50 mA at 0.7 volts as compared to approximately 1 A at 1.3 volts). Therefore, a simple power supply may be designed to provide 1 A at all voltage levels, while an optimized power supply could be designed to provide slightly more current than needed at different voltage levels. The simple power supply may then have difficulty providing 1 A at 0.7 volts and still have a high on-current to off-current ratio.

Figure 9:
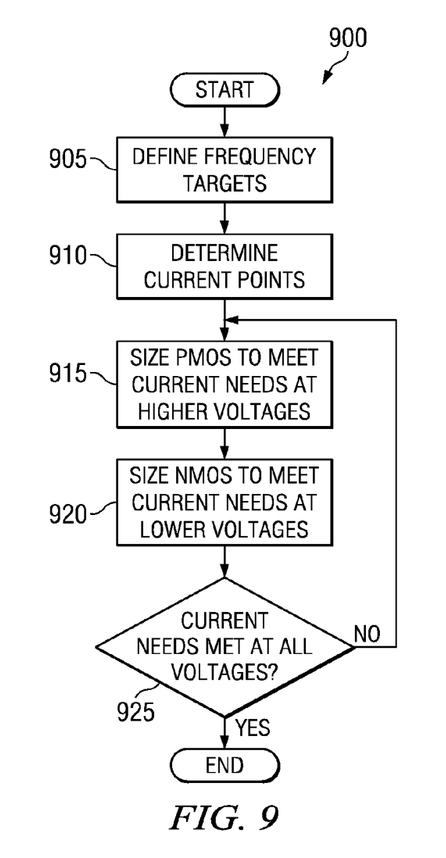
FIG. 9 is a flow diagram of a process for designing a combination switch to meet specified performance requirements, according to a preferred embodiment of the present invention.

With reference now to FIG. 9, there is shown a flow diagram illustrating a process 900 for designing the combination switch 410 to meet specified performance requirements, according to a preferred embodiment of the present invention. The process 900 may illustrate the design of the combination switch 410 to meet a particular set of performance requirements. The process 900 may begin with a designer of the combination switch 410 defining a set of frequency targets for logic circuits that will make use of the combination switch 410 (block 905). As discussed previously, the frequency targets can be specified for a range of different voltage supply levels. Note that the frequency target points may have been specified for the designer. From the set of frequency targets, the designer can determine a corresponding set of current requirements (block 910). The set of current requirements can be used as a design specification for the combination switch 410, wherein the combination switch 410 must meet or exceed the set of current requirements.

Using set of current requirements (determined in block 910), the designer can size the PMOS transistors (block 915) to provide the needed current at the higher ranges of the voltage supply levels and the NMOS transistors (block 920) to provide the needed current at the lower ranges of the voltage supply levels. The designer can make use of different computer aided engineering or design tools available to determine the proper sizing for the PMOS and NMOS transistors. The designer can then verify (through the use of engineering and/or simulation tools) that the combination switch 410 with the properly sized PMOS and NMOS transistors can meet the current requirements of the logic circuits in the range of voltage supply levels (block 925). If the combination switch 410 does indeed meet the current requirements, then the design process is complete and can terminate. If the combination switch 410 does not meet the current requirements, then the designer may need to return to blocks 915 and 920 to redesign the combination switch 410. The process 900 can continue until a design for the combination switch 410 meeting the current requirements is made.

Figure 10:
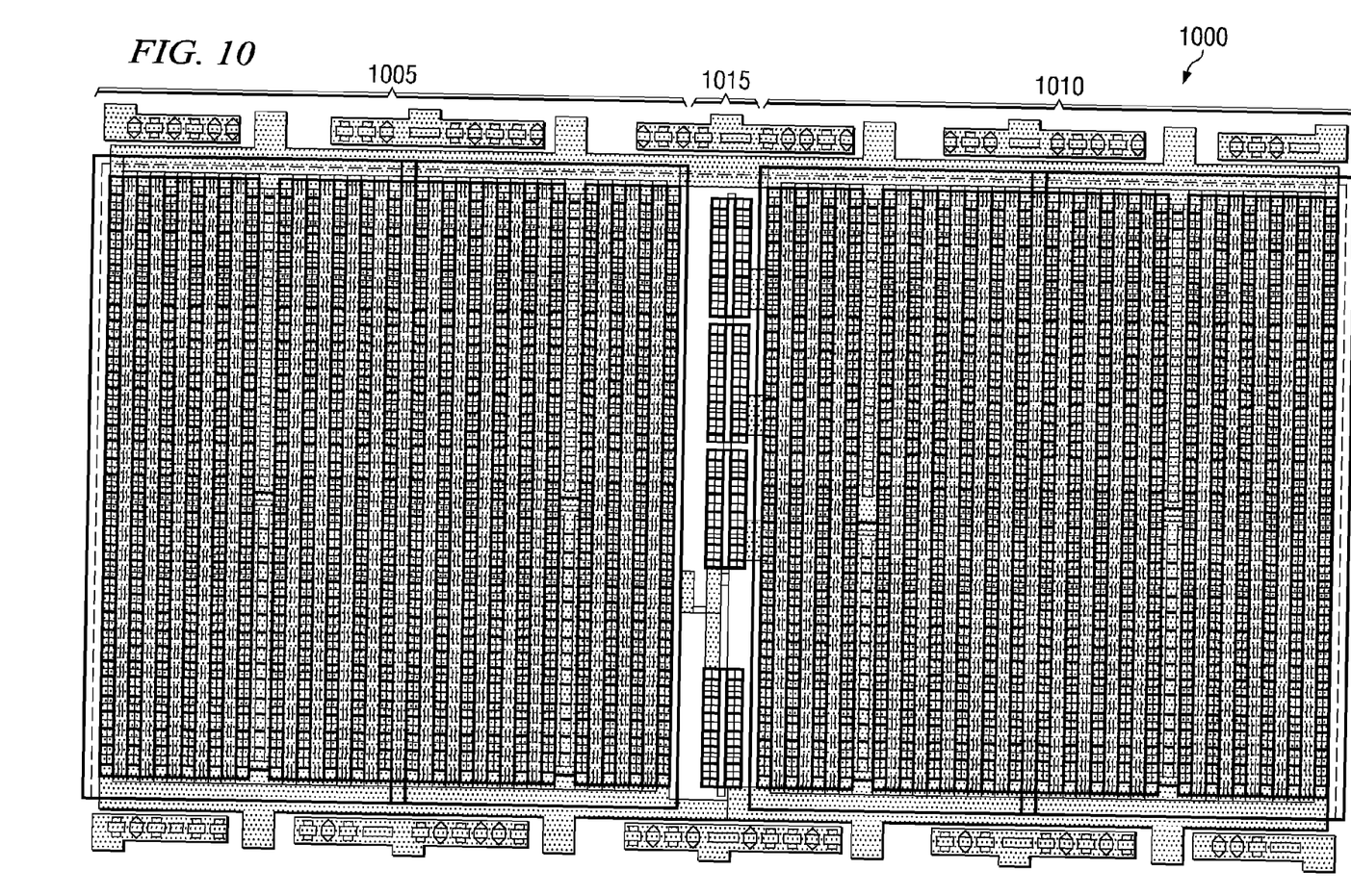
FIG. 10 is a diagram of a layout for an exemplary combination switch, according to a preferred embodiment of the present invention.

With reference now to FIG. 10, there is shown a diagram illustrating a layout 1000 of an exemplary combination switch, according to a preferred embodiment of the present invention. The layout 1000 of the combination switch meets a set of performance specifications, such as the current requirements shown in FIG. 8. The layout 1000 shows a combination switch made from two banks of PMOS transistors 1005 and 1010 and a bank of NMOS transistors 1015, the NMOS transistors located between the two banks of PMOS transistors. Note that due to fabrication process restrictions on the size of transistors, the PMOS and NMOS transistors used in the combination switch is made from a plurality of transistors coupled together in parallel. Logically, the two banks of PMOS transistors 1005 and 1010 can be represented as a single PMOS transistor, such as the PMOS transistor 505 (FIG. 5) and the bank of NMOS transistors 1015 can be represented as a single NMOS transistor, such as the NMOS transistor 510 (FIG. 5).

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A combination header switch for use in providing power to circuitry in an integrated circuit, the combination header switch comprising:
    a PMOS (P-type Metal Oxide Semiconductor) transistor having a gate terminal coupled to a first control signal line, the PMOS transistor also having a first source/drain terminal and a second source/drain terminal;
    an NMOS (N-type Metal Oxide Semiconductor) transistor having a gate terminal coupled to a second control signal line, the NMOS transistor also having a first source/drain terminal and a second source/drain terminal;
    wherein the first source/drain terminal of the PMOS transistor and the first source/drain terminal of the NMOS transistor are coupled to a voltage supply and wherein the second source/drain terminal of the PMOS transistor and the second source/drain terminal of the NMOS transistor are coupled to an output of the combination header switch; and
    wherein the PMOS transistor is an I/O (input/output) transistor and the NMOS transistor is a core transistor.

2. The combination header switch of claim 1, wherein a threshold voltage of the PMOS transistor is larger than a threshold voltage of the NMOS transistor and a width of the PMOS transistor is greater than a width of the NMOS transistor.

3. The combination header switch of claim 1, wherein the first and the second control signal lines carry control signals based on a single control signal.

4. The combination header switch of claim 1, wherein the first source/drain terminal of the PMOS transistor is a source terminal, wherein the second source/drain terminal of the PMOS transistor is a drain terminal wherein the first source/drain terminal of the NMOS transistor is a drain terminal, and wherein the second source/drain terminal of the NMOS transistor is the source terminal.

5. The combination header switch of claim 1, wherein the size of the PMOS transistor and the size of the NMOS transistor are selected to provide required current levels to the circuitry as a function of voltage supply level.

6. A combination header switch for use in providing power to circuitry in an integrated circuit, the combination header switch comprising:
    a PMOS (P-type Metal Oxide Semiconductor) transistor having a gate terminal coupled to a first control signal line, the PMOS having a first source/drain terminal and a second source/drain terminal;
    an NMOS (N-type Metal Oxide Semiconductor) transistor having a gate terminal coupled to a second control signal line, the NMOS transistor also having a first source/drain terminal and a second source/drain terminal;
    wherein the first source/drain terminal of the PMOS transistor and the first source/drain terminal of the NMOS transistor are coupled to a voltage supply and wherein the second source/drain terminal of the PMOS transistor and the second source/drain terminal of the NMOS transistor are coupled to an output of the combination header switch;
    wherein a threshold voltage of the PMOS transistor is larger than a threshold voltage of the NMOS transistor and a width of the PMOS transistor is greater than a width of the NMOS transistor;

wherein the PMOS transistor comprises a plurality of PMOS transistors and the NMOS transistor comprises a plurality of NMOS transistors, and wherein a total width of the plurality of PMOS transistors is greater than a total width of the plurality of NMOS transistors.

7. The combination header switch of claim 6, wherein the total width of the plurality of PMOS transistors is greater than 10 times the total width of the plurality of NMOS transistors.

8. The combination header switch of claim 6, wherein the combination header switch protects core circuits and the combination header switch is between an upper supply rail (VDD) and an upper circuit rail (VDDLSW) of the core circuits.

9. A combination header switch for use providing power to circuitry in an integrated circuit, the combination header switch comprising:
   a PMOS (P-type Metal Oxide Semiconductor) transistor a gate terminal coupled to a first control signal line, the PMOS transistor also having a first source/drain terminal and a second source/drain terminal;
   an NMOS (N-type Metal Oxide Semiconductor) transistor having a gate terminal coupled to a second control signal line, the NMOS transistor also having a first source/drain terminal and a second source/drain terminal;
   wherein the first source/drain terminal of the PMOS transistor and the first source/drain terminal of the NMOS transistor are coupled to a voltage supply and wherein the second source/drain terminal of the PMOS transistor and the second source/drain terminal of the NMOS transistor are coupled to an output of the combination header switch; and
   wherein the PMOS transistor comprises a plurality of PMOS transistors coupled in parallel, each PMOS transistor having a first source/drain terminal coupled to the voltage supply, a second source/drain terminal coupled to the output, and a gate terminal coupled to the first control signal line, wherein the NMOS transistor comprises a plurality of NMOS transistors coupled in parallel, each NMOS transistor having a first source/drain terminal coupled to the voltage supply, a second source/drain terminal coupled to the output, and a gate terminal coupled to the first control signal line, wherein a size of the NMOS transistor is used to determine the number of NMOS transistors in the plurality of NMOS transistors and wherein a size of the PMOS transistor is used to determine the number of PMOS transistors in the plurality of PMOS transistors, wherein the size of the PMOS transistor and the size of the NMOS transistor is selected to provide a required current level to the circuitry as a function of voltage supply level.

10. A combination header switch for use in providing power to circuitry in an integrated circuit, the combination header switch comprising:
   a PMOS (P-type Metal Oxide Semiconductor) transistor having a gate terminal coupled to a first control signal line, the PMOS transistor also having a first source/drain terminal and a second source/drain terminal;
   an NMOS (N-type Metal Oxide Semiconductor) transistor having a gate terminal coupled to a second control signal line the NMOS transistor also having a first source/drain terminal and a second source/drain terminal;
   wherein the terminal of the PMOS transistor and the first source/drain terminal of the NMOS transistor are to a voltage supply and wherein the second source/drain terminal of the PMOS transistor and the second source/drain terminal of the NMOS transistor are coupled to an output of the combination header switch; and
   wherein the PMOS transistor comprises a plurality of PMOS transistors coupled in parallel, each PMOS transistor having a first source/drain terminal coupled to the voltage supply, a second source/drain terminal coupled to the output, and a gate terminal coupled to the first control signal line.

11. A combination header switch for use in power to circuitry in an integrated circuit, the combination header switch comprising:
   a PMOS (P-type Metal Oxide Semiconductor) transistor having a gate terminal coupled to a first control signal line the PMOS transistor also having a, first source/drain terminal and a second source/drain terminal;
   an NMOS (N-type Metal Oxide Semiconductor) transistor having a gate terminal coupled to a second control signal line the NMOS transistor also having a first source/drain terminal and a second source/drain terminal;
   wherein, the first source/drain terminal of the PMOS transistor and the first source/drain terminal of the NMOS transistor are coupled to a voltage supply and wherein the second source/drain terminal of the PMOS transistor and the second source/drain terminal of the NMOS transistor are coupled to an output of the combination header switch; and
   wherein the NMOS transistor comprises a plurality of NMOS transistors coupled in parallel, each NMOS transistor having a first source/drain terminal coupled to the voltage supply, a second source/drain terminal coupled to the output, and a gate terminal coupled to the first control signal line.

12. An integrated circuit comprising:
   a logic circuit; and
   a combination header switch coupled between a voltage supply and the logic circuit, the combination header switch configured to provide current to the logic circuit as a function of the level of the voltage supply, and wherein the combination header switch comprises:
      a plurality of NMOS transistors coupled in parallel, each NMOS transistor having a first source/drain terminal coupled to the voltage supply a second source/drain terminal coupled to the logic circuit, and a gate terminal coupled to a first control signal line; and
      a plurality of PMOS transistor coupled in parallel, each PMOS transistor having a first source/drain terminal coupled to the voltage supply, a second source/drain terminal coupled to the logic circuit, and a gate terminal coupled to the first control signal line.

13. The combination header switch of claim 12, wherein the PMOS transistor is an I/O (input/output) transistor.

14. The combination header switch of claim 12, wherein the NMOS transistor is a core transistor.

15. The integrated circuit of claim 12 the number of NMOS transistors in the plurally of NMOS transistors is determined by a size of a designed NMOS transistor and wherein the number of PMOS transistors in the plurality of PMOS transistors is determined by a size of a designed PMOS transistor, wherein the size of the designed PMOS transistor and the size of the designed NMOS transistor is selected to provide a required current level to the circuitry as a function of voltage supply level.

16. The integrated circuit of claim 12, wherein the combination header switch is between an upper supply rail (VDD) and an upper circuit rail (VDDLSW) of the logic circuit.

17. A combination header switch for use in providing power to circuitry in an integrated circuit, the combination header switch comprising;
- a PMOS (P-type Metal Oxide Semiconductor) transistor having a gate terminal coupled to a first control signal line, the PMOS transistor also having a first source/drain terminal and a second source/drain terminal;
- an NMOS (N-type Metal Oxide Semiconductor) transistor having a gate terminal coupled to a second control signal line, the NMOS transistor also having a first source/drain terminal and a second source/drain terminal;

wherein the first source/drain terminal of the PMOS transistor and the first source/drain terminal of the NMOS transistor are coupled to a voltage supply and wherein the second source/drain terminal of the PMOS transistor and the second source/drain terminal of the NMOS transistor are coupled to an output of the combination header switch, and wherein a first layout of the PMOS transistor comprises two banks and a second layout of the NMOS transistor is between said two banks.

18. The combination header switch of claim 17, wherein the PMOS transistor is an I/O (input/output) transistor.

19. The combination header switch of claim 17, wherein the NMOS transistor is a core transistor.

* * * * *